United States Patent
Knieriem

(10) Patent No.: US 6,632,995 B1
(45) Date of Patent: Oct. 14, 2003

(54) CONTROL CABINET

(75) Inventor: Harald Knieriem, Bad Koenig (DE)

(73) Assignee: Deutsche Telekom AG, Bonn (DE)

( * ) Notice: Subject to any disclaimer, the term of this patent is extended or adjusted under 35 U.S.C. 154(b) by 0 days.

(21) Appl. No.: 09/937,921

(22) PCT Filed: Mar. 21, 2000

(86) PCT No.: PCT/EP00/02477

§ 371 (c)(1), (2), (4) Date: Dec. 13, 2001

(87) PCT Pub. No.: WO00/60713

PCT Pub. Date: Oct. 12, 2000

(30) Foreign Application Priority Data

Mar. 30, 1999 (DE) .......................... 199 14 408

(51) Int. Cl.⁷ .................................. H01J 5/00
(52) U.S. Cl. .................. 174/50; 174/58; 174/17 R; 220/4.02; 248/906; 439/535
(58) Field of Search .............. 174/50, 58, 63, 174/17 R, 60; 220/4.02, 3.6, 3.8, 3.2; 312/223.6; 29/729, 772; 248/906; 439/535

(56) References Cited

U.S. PATENT DOCUMENTS

| | | | | |
|---|---|---|---|---|
| 6,005,188 A | * | 12/1999 | Teichler et al. | 174/50 |
| 6,191,358 B1 | * | 2/2001 | Daoud | 174/50 |
| 6,348,655 B1 | * | 2/2002 | Wright | 220/4.02 X |
| 6,407,332 B1 | * | 6/2002 | Buchberger et al. | 174/50 |

FOREIGN PATENT DOCUMENTS

| | | |
|---|---|---|
| DE | 29 11 920 | 10/1980 |
| DE | 40 08 032 | 9/1991 |
| DE | 41 13 170 | 11/1991 |
| DE | 93 01 863 | 5/1993 |
| DE | 43 16 967 | 7/1994 |
| DE | 43 37 565 | 3/1995 |
| DE | 196 09 689 | 9/1997 |
| DE | 297 10 348 | 9/1997 |
| DE | 198 07 804 | 9/1998 |
| DE | 197 14 838 | 10/1998 |
| DE | 197 20 842 | 11/1998 |
| DE | 197 35 067 | 2/1999 |
| EP | 0 514 668 | 11/1992 |
| EP | 0 560 191 | 9/1993 |
| GB | 2 025 144 | 1/1980 |

* cited by examiner

Primary Examiner—Dhiru R Patel
(74) Attorney, Agent, or Firm—Kenyon & Kenyon

(57) ABSTRACT

A control cabinet for installing electronic equipment includes a bottom, wall parts which may be disassembled, at least one door and a top, in which devices for securing the equipment, particularly withdrawable mount fixtures, may be arranged in the control cabinet and cable lead-throughs may be provided on the control cabinet. The walls may be produced from fire-resistant material. An air conditioner is provided for regulating the temperature in the control cabinet. The openings and cable lead-throughs of the control cabinet may act in a self-sealing manner in case of fire. Furthermore, a method for assembling a control cabinet around an apparatus rack fitted with equipment in operation.

18 Claims, 3 Drawing Sheets

CONTROL CABINET

FIELD OF THE INVENTION

The present invention relates to a control cabinet for the installation of electronic equipment. The control cabinet may include a bottom, wall parts which are able to be disassembled, at least one door and a top. Devices for securing the equipment, particularly withdrawable mount fixtures, are arranged in the control cabinet, and cable lead-throughs are provided on the control cabinet. The present invention further relates to a method for assembling the control cabinet.

BACKGROUND INFORMATION

To protect against fires, spaces in which powerful electronic equipment such as, for example, network servers or modem cabinets, are set up which should meet special safety standards (e.g., DIN [German Industrial Standard] 4102). Provision should be made so that the space is able to withstand a fire for a certain specified time without considerable effects of the fire being noted outside of the space.

Such spaces, if they do not satisfy the demands for object protection and fire protection, should for the most part be disassembled with considerable expenditure and equipped with an air-conditioning system. In the event the installation site of the equipment is frequently changed, a new space should be prepared each time.

Such spaces should fulfill certain requirements for object protection (access protection, break-in protection). To indicate the capacity for resistance against unauthorized access to the electronic devices, norms exist (e.g., DIN 18103ET 3) as to how a space is to be constructed. In this case, the same problems occur analogously as above when the installation site is changed frequently.

A space should also be provided for the installation of electronic equipment offer protection against humidity, spray water, dust, vandalism and theft.

To permit easy transportation and assembly of electronic equipment, electronics cabinets are available which are equipped with withdrawable mount fixtures for securing the equipment. Such cabinets are provided with cable lead-throughs for connecting the installed equipment to the outside world. They are frequently provided with built-in ventilation devices and voltage sources.

SUMMARY OF THE INVENTION

The present invention is directed to providing an exemplary control cabinet device and/or exemplary method which meets the aforesaid requirements for fire protection, and which protects the installed equipment from unauthorized access.

An exemplary embodiment and/or exemplary method of the present invention is directed to providing that the bottom, wall parts, top and doors are produced from fire-resistant material. An air-conditioning system is provided for regulating the temperature in the control cabinet. The air-conditioning system is provided with ventilation openings that close automatically in the event of a fire. The cable lead-throughs are constructed as fire barriers which act in a self-sealing manner in case of fire. The doors of the control cabinet are provided with an electromechanical lock works which can be unlocked by an actuation device mounted outside on the control cabinet. The doors of the control cabinet are provided with seals acting in a self-sealing manner in the event of fire. When using a control cabinet according to the exemplary embodiment of the present invention, a space disassembly (or enlargement) is unnecessary, since all the devices are hermetically partitioned.

In addition, devices can be provided to monitor and record door openings, access attempts, fire events, the voltage supply, the correct functioning of the air-conditioning system and the temperature in the control cabinet, the devices possessing suitable sensors in the control cabinet and being connected to means for switching off the voltage supply of the equipment in the event of danger. In an alternative embodiment, the device(s) can be configured to send out a warning signal if there is an excessive temperature in the control cabinet, and then switch off a voltage supply of the electronic equipment in the control cabinet if there is a further excessive temperature. In an alternative embodiment, the control cabinet may be connected to a data line and/or a telephone line for transmitting a warning signal in a dangerous condition. In an alternative embodiment, the control cabinet can be connected to an acoustical signal transmitted for transmitting a warning signal in a dangerous condition. The doors can be unlocked mechanically by an emergency key in case of fire.

When assembling a control cabinet during the operation of equipment that is arranged in a separate apparatus rack, provision is made to lift the apparatus rack, to push the bottom of the control cabinet underneath, to assemble control-cabinet parts, to provide the fire-barrier frames set into the cabinet parts with fire-proof material, and to insert the cable sets leading to the outside into the fire-barrier frames. In this way, equipment can be installed in a control cabinet according to the present invention without having to interrupt operation.

The fire-barrier frames on the control-cabinet parts are constructed such that the cables can be led through in the open state (that is, when the control cabinet is open and/or disassembled). In an exemplary embodiment and/or exemplary method, the fire-barrier frames are set into the side parts, the top or the doors, and after introducing the cables, are closed by a metal bar on the respective opposite cabinet part when putting the cabinet together. In a further embodiment, the fire barrier includes a frame open to one side into which a forming material and at least one cable are insertable so that the at least one cable already connected can be installed, and at least one cutout for accommodating the fire barrier is provided on at least one part of the control cabinet.

DETAILED DESCRIPTION

Figure 1:
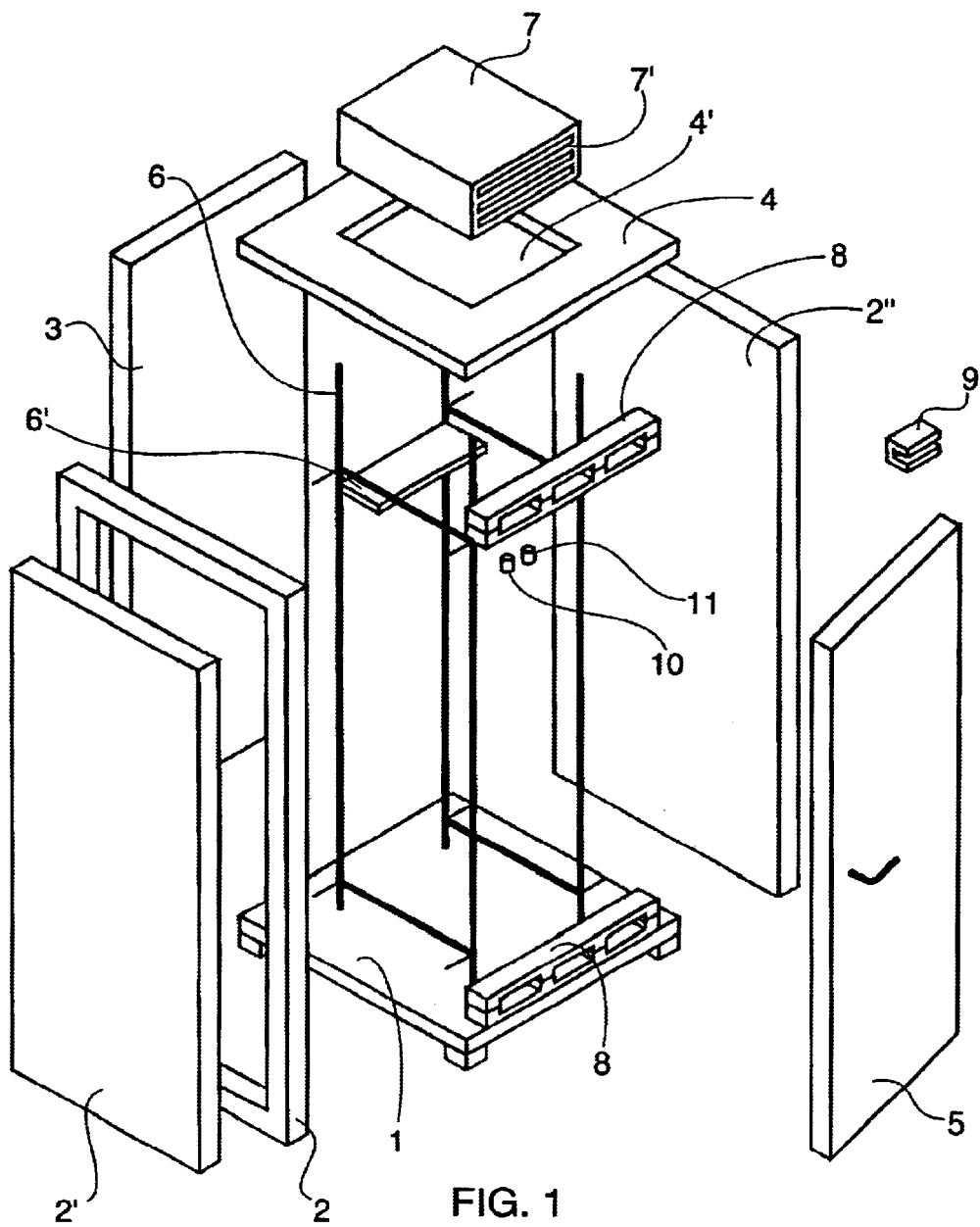
FIG. 1 shows schematically a control cabinet according to an exemplary embodiment of the present invention in an exploded view.

FIG. 1, in an exploded view, shows an exemplary control cabinet according to the present invention for installing electronic equipment such as network control units and power supply units, computers, modem cabinets and the like. Mounted on a bottom plate 1 made of fire-resistant material are side parts 2, 3, 2", as well as a firebarrier frame 8 for the cable lead-through and a mounting frame or device 6 with module racks 6' of 19-inch width for securing built-in equipment of standardized size. A tightly closing door 5 may permit access to the cabinet interior. Top 4 of the control cabinet has a cut-out 4' for accommodating an air conditioner 7 which regulates the temperature inside the control cabinet and is provided with ventilation openings 7' for dissipating heat. In alternative exemplary embodiments, air conditioner 7 may be mounted in a side wall or door. In alternative exemplary embodiments, an air circulation/ ventilation device including at least one ventilator is arranged in tie control cabinet. In alternative exemplary embodiments, the electronic equipment may be disposed in the control cabinet so that a space for laying at least one connecting cable is provided between the electronic equipment and at least one door. A reader unit 9 for chip cards is attached outside on the control cabinet. Door 5 may be unlocked by inserting a chip card.

To monitor the cabinet interior, temperature sensor 10 and a fire detector 11 may be provided which are connected to a power-supply and monitoring device 12. The power-supply device includes terminal strips for the voltage supply of the equipment installed in the cabinet, and contains fuses. In addition, it may be used for monitoring the voltage supply and other performance quantities. The monitoring device, via microswitches or reed contacts (not shown), may register when the cabinet is opened. It also is provided with an apparatus, arrangement or structure for recording the monitored quantities, as well as for interrupting the voltage supply in the event of danger.

The gaps and joints between the individual parts of the control cabinet, as well as ventilation openings 7' and cable lead-throughs 8 may be coated with a substance that foams up in response to strong heating, so that a reliable seal is implemented in the case of fire. The fire barrier(s) of the control cabinet include a foaming material that foams up to provide a seal in response to strong heating.

Figure 2:
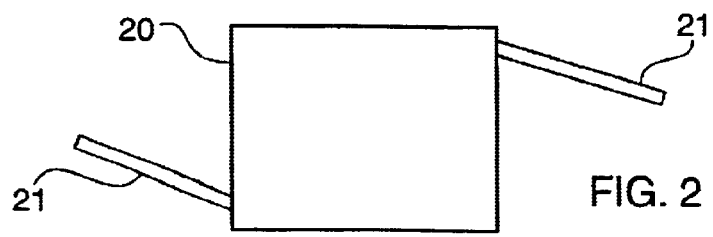
FIG. 2 shows schematically a top view of an exemplary control cabinet having two doors.

FIG. 2 shows a top view of another control cabinet 20 according to the present invention. In this exemplary embodiment, doors 21 are arranged on two sides.

Figure 3:
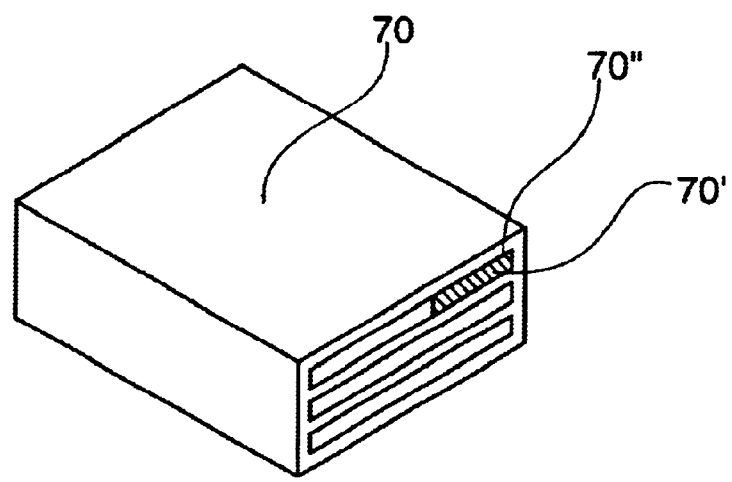
FIG. 3 shows schematically an exemplary air circulation/ventilation device for a control cabinet.

FIG. 3 shows an air circulation/ventilation device 70, e.g., an air conditioner, which regulates the temperature inside the control cabinet and is provided with ventilation openings 70' for dissipating heat. The ventilation openings 70' are provided with inserts 70" which, in response to strong heating, foam up to provide a seal.

Figure 4:
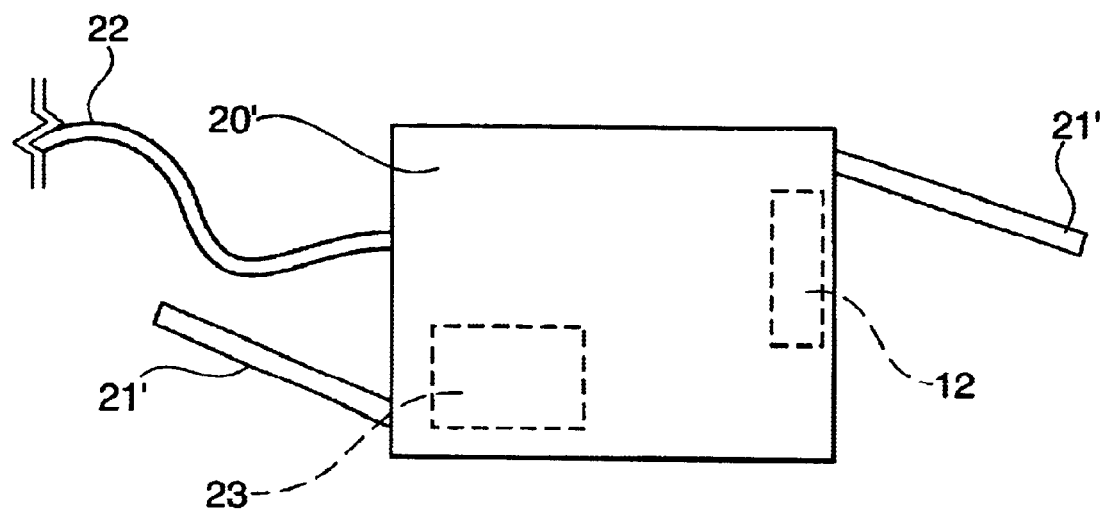
FIG. 4 shows schematically a top view of an exemplary control cabinet having two doors which is connected to a data line and/or telephone line.

FIG. 4 shows a top view of another control cabinet 20' according to the present invention In this exemplary embodiment, doors 21' are arranged on two sides and a multiple socket outlet 23 for connecting to the electronic equipment is disposed within the control cabinet. The view also shows an exemplary power supply and monitoring device 12.

Figure 5:
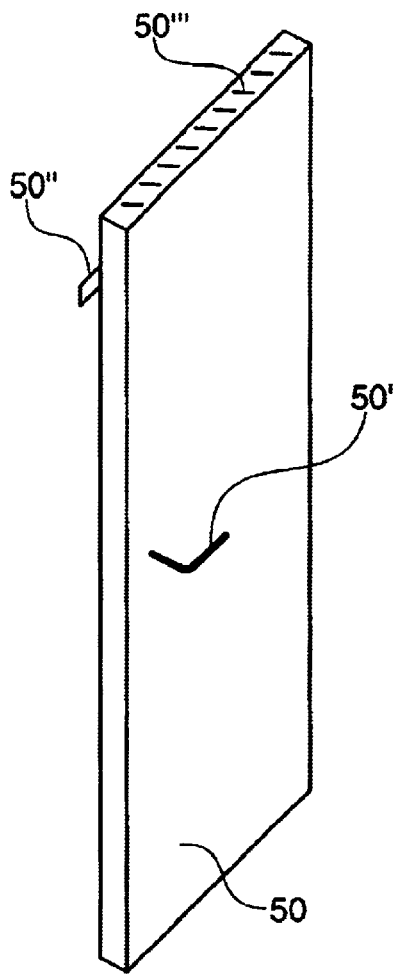
FIG. 5 shows schematically an exemplary door of a control cabinet.

FIG. 5 shows an exemplary door 50 of a control cabinet according to the present invention. The door 50 is coated with a substance 50''' that foams up in response to strong heating, so that a reliable seal is implemented in case of fire. The door 50 also has a door handle 50' and an electromechanical lock 50".

Figure 6:
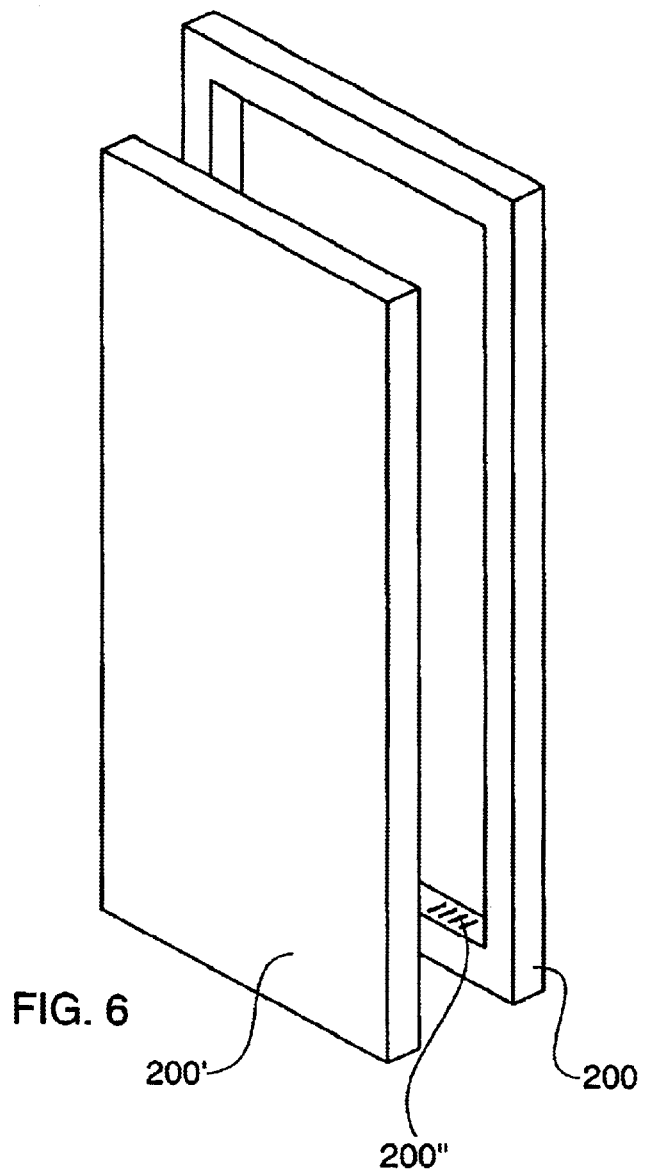
FIG. 6 shows schematically an exemplary removable side wall of a control cabinet.

FIG. 6 shows an exemplary side wall 200 having a part 200' which is removable and having a sealing device 200" which foams up in response to strong heating. To join a plurality of cabinets together, at least a part 200' of the side wall 200 is removable and the cabinets are able to be joined together at the openings thus obtained. The openings provide attachment points. The attachment points are sealed with sealing devices 200" which foam up in response to strong heating.

What is claimed is:

1. A control cabinet for installing electronic equipment, comprising:

a bottom;

at least one wall part being configured to be disassembled;

atop;

an electromechanical lock arrangement;

an actuation device mounted on an outer side of the control cabinet, the actuation device being operable to unlock the electromechanical lock arrangement;

at least one mounting device to secure the electronic equipment within the control cabinet;

at least one cable lead-through provided on the control cabinet, the at least one cable lead-through being constructed as a fire barrier and acting in a self-sealing manner in a fire;

an air conditioner to regulate a temperature in the control cabinet, and including ventilation openings that close automatically in the fire; and at least one door including the electromechanical lock arrangement and a seal, and being arranged to act in a self-sealing manner in the fire;

wherein the bottom, the at least one wall part, the top and the at least one door are produced from fire-resistant material.

2. The control cabinet of claim 1, further comprising:

at least one monitoring and recording device to monitor and record an opening of the at least one door, any access attempt, the fire, a voltage supply, a functioning of the air conditioner, and the temperature in the control cabinet; and at least one sensor device in the control cabinet, and being connected to an arrangement to switch off the voltage supply of the electronic equipment in a dangerous condition.

3. The control cabinet of claim 1, wherein the ventilation openings include at least one insert, the at least one insert being configured to foam up to provide a seal in response to strong heating.

4. The control cabinet of claim 1, wherein the air conditioner is insertable to fit into an opening of the control cabinet, the ventilation openings being arranged on a housing of the air conditioner.

5. The control cabinet of claim 1, further comprising an air circulation/ventilation device including an at least one ventilator arranged in the control cabinet.

6. The control cabinet of claim 1, wherein the fire barrier includes a foaming material that foams up to provide a seal in response to strong heating.

7. The control cabinet of claim 6, wherein the fire barrier includes a frame open to one side into which a foaming material and at least one cable are insertable so that the at least one cable already connected can be installed, and at least one cutout for accommodating the fire barrier is provided on at least one part of the control cabinet.

8. The control cabinet of claim 1, wherein at least a section of the at least one wall part is removable to provide an opening so that the control cabinet is joinable to another control cabinet at the opening, the opening providing an attachment point, the attachment point being sealable with a sealing device configured to foam up in response to strong heating.

9. The control cabinet of claim 1, wherein the electronic equipment is disposed in the control cabinet so that a space for laying at least one connecting cable is provided between the electronic equipment and the at least one door.

10. The control cabinet of claim 1, further comprising at least one multiple socket outlet for connecting to the electronic equipment, wherein the at least one multiple socket is disposed within the control cabinet.

11. The control cabinet of claim 1, further comprising a voltage monitoring device to monitor a voltage being supplied to the electronic equipment.

12. The control cabinet of claim 1, further comprising a card reader unit for at least one of a magnetic card and a chip card, the card reader unit being arranged on an outer side of the control cabinet, wherein the electromechanical lock arrangement associated with the at least one door is unlockable via a control device disposed within an inner side of the control cabinet by inserting an appropriate card into the card reader unit.

13. The control cabinet of claim 1, wherein the control cabinet is connected to an at least one of a data line and a telephone line for transmitting a warning signal in a dangerous condition.

14. The control cabinet of claim 1, wherein the control cabinet is connected to an acoustical signal transmitter for transmitting a warning signal in a dangerous condition.

15. The control cabinet of claim 1, wherein the at least one mounting device for securing the electronic equipment within the control cabinet includes a withdrawable mount fixture.

16. A method for assembling a control cabinet, comprising:

providing a bottom;

providing at least one wall part being configured to be disassembled;

providing a top;

providing an electromechanical lock arrangement;

mounting an actuation device on an outer side of the control cabinet, the actuation device being operable to unlock the electromechanical lock arrangement;

providing at least one device to secure the electronic equipment within the control cabinet;

providing at least one cable lead-through on the control cabinet, the at least one cable lead-through being constructed as a fire barrier and acting in a self-sealing manner in a fire;

providing an air conditioner to regulate a temperature in the control cabinet, the air conditioner including ventilation openings that close automatically in the fire; and providing at least one door, and including the electromechanical lock arrangement and a seal in the at least one door, so that it is arranged to act in a self-sealing manner in the fire; and during operation of the electronic equipment arranged on a separate apparatus rack of the control cabinet, performing the steps of:

lifting the separate apparatus rack, pushing a bottom side underneath the separate apparatus rack, assembling the at least one wall part, assembling at least one fire barrier frame set into the at least one wall part, the at least one fire barrier frame including fireproof material, and inserting a cable leading to an outer side of the control cabinet into the at least one fire barrier frame;

wherein the bottom, the at least one wall part, the top and the at least one door are produced from fire-resistant material.

17. A method for operating a control cabinet for installing electronic equipment, the method comprising:

sending out a warning signal if there is an excessive temperature in the control cabinet; and switching off a voltage supply of the electronic equipment in the control cabinet if there is a further excessive temperature;

wherein the control cabinet includes:

a bottom;

at least one wall part being configured to be disassembled;

a top;

an electromechanical lock arrangement;

an actuation device mounted on an outer side of the control cabinet, the actuation device being operable to unlock the electromechanical lock arrangement;

at least one device to secure the electronic equipment within the control cabinet;

at least one cable lead-through provided on the control cabinet, the at least one cable lead-through being constructed as a fire barrier and acting in a self-sealing manner in a fire;

an air conditioner to regulate a temperature in the control cabinet, and including ventilation openings that close automatically in the fire;

at least one door including the electromechanical lock arrangement and a seal, and being arranged to act in a self-sealing manner in the fire; and wherein the bottom, the at least one wall part, the top and the at least one door of the control cabinet are produced from fire-resistant material.

18. The method of claim 17, further comprising switching off the voltage supply of the electronic equipment in the fire.

* * * * *